United States Patent
Senoo et al.

(10) Patent No.: US 12,224,037 B2
(45) Date of Patent: Feb. 11, 2025

(54) APPARATUSES AND METHODS OF MEMORY ACCESS CONTROL WITH SECTION PREDECODING AND SECTION SELECTION

(71) Applicant: Micron Technology, Inc., Boise, ID (US)

(72) Inventors: Manami Senoo, Tokyo (JP); Hidekazu Noguchi, Tokyo (JP); Yoshio Mizukane, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 199 days.

(21) Appl. No.: 17/840,461

(22) Filed: Jun. 14, 2022

(65) Prior Publication Data

US 2023/0402070 A1    Dec. 14, 2023

(51) Int. Cl.
*G11C 7/10* (2006.01)
*G11C 7/08* (2006.01)

(52) U.S. Cl.
CPC ............ *G11C 7/1039* (2013.01); *G11C 7/08* (2013.01); *G11C 7/1063* (2013.01); *G11C 7/109* (2013.01)

(58) Field of Classification Search
CPC ....... G11C 7/1039; G11C 7/08; G11C 7/1063; G11C 7/109; G11C 29/76; G11C 8/12; G11C 8/10; G11C 5/025
See application file for complete search history.

(56) References Cited

U.S. PATENT DOCUMENTS

| | | | |
|---|---|---|---|
| 2005/0285862 A1* | 12/2005 | Noda | G11C 7/1006 345/530 |
| 2016/0078919 A1* | 3/2016 | Han | G11C 5/02 365/207 |
| 2020/0185026 A1* | 6/2020 | Yun | G11C 11/4085 |

\* cited by examiner

Primary Examiner — Sultana Begum
(74) *Attorney, Agent, or Firm* — Dorsey & Whitney LLP (57) ABSTRACT

Apparatuses and methods for controlling access to memory cell matrices are described. An example apparatus includes: a plurality of memory cell matrices including memory cells, a plurality of sections wherein each section is included in a memory cell matrix of the plurality of memory cell matrices; a section predecoder that activates one section signal among a plurality of corresponding section signals responsive to a portion of row address signals; a section selection control circuit that provides a set of first section sub signals including an active first section sub signal and a set of second section sub signals including an active second section sub signal based on the plurality of section signals; and a plurality of section selection circuits corresponding to the plurality of sections. One section selection circuit among the plurality of section selection circuits activates the corresponding section responsive to the active first and second section sub signals.

19 Claims, 9 Drawing Sheets

Section<2>="1"

FIG. 3B

| Section | Section_A<5:0> | Section_B<3:0> |
|---|---|---|
| 0 | 000001 (0) | 0001 (0) |
| 1 | 000001 (0) | 0010 (1) |
| 2 | 000001 (0) | 0100 (2) |
| 3 | 000001 (0) | 1000 (3) |
| 4 | 000010 (1) | 0001 (0) |
| 5 | 000010 (1) | 0010 (1) |
| 6 | 000010 (1) | 0100 (2) |
| 7 | 000010 (1) | 1000 (3) |
| 8 | 000100 (2) | 0001 (0) |
| 9 | 000100 (2) | 0010 (1) |
| 10 | 000100 (2) | 0100 (2) |
| 11 | 000100 (2) | 1000 (3) |
| 12 | 001000 (3) | 0001 (0) |
| 13 | 001000 (3) | 0010 (1) |
| 14 | 001000 (3) | 0100 (2) |
| 15 | 001000 (3) | 1000 (3) |
| 16 | 010000 (4) | 0001 (0) |
| 17 | 010000 (4) | 0010 (1) |
| 18 | 010000 (4) | 0100 (2) |
| 19 | 010000 (4) | 1000 (3) |
| 20 | 100000 (5) | 0001 (0) |
| 21 | 100000 (5) | 0010 (1) |
| 22 | 100000 (5) | 0100 (2) |

| Block<1:0> | Row Address16 | Row Address15 |
|---|---|---|
| 00 (0) | 0 | 0 |
| 01 (1) | 0 | 1 |
| 10 (2) | 1 | 0 |

APPARATUSES AND METHODS OF MEMORY ACCESS CONTROL WITH SECTION PREDECODING AND SECTION SELECTION

BACKGROUND

High data reliability, high speed of memory access, reduced chip size and reduced power consumption are features that are demanded from semiconductor memory.

Recently, some semiconductor memory devices include a folded bit line structure in edge mats in a memory cell array. The folded bit line structure may allow the edge mats to include bit lines having a same bit line length as other memory mats in the memory cell array, but have a reduced area. A number of word lines that access each edge mat is less than a number of word lines that access each mat of the mats between edge mats ("non-edge mats"). Because of the inconsistency in the number of word lines and alignment of bit lines and memory cells between the non-edge mats and edge mats, mat selection circuits with different circuit structures are provided for non-edge mats and edge mats for access. The different circuit structures of the mat selection circuits increase a number of wirings and thus may increase a chip area. To reduce the chip area and power consumption, more efficient circuit structures for selecting memory access areas may be desired.

DETAILED DESCRIPTION

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Each edge mat and non-edge mat may be divided into sections. A size of each section (e.g., a number of word lines coupled to each section) may be the same for edge mats and non-edge mats. Each non-edge mat may include a plurality of sections. Section selection circuits may be provided for accessing corresponding sections. The section selection circuits may have substantially similar circuit structures. By having the section selection circuits of the similar circuit structures, a number of wirings may be reduced and thus a chip area and power consumption may be reduced.

Figure 1:
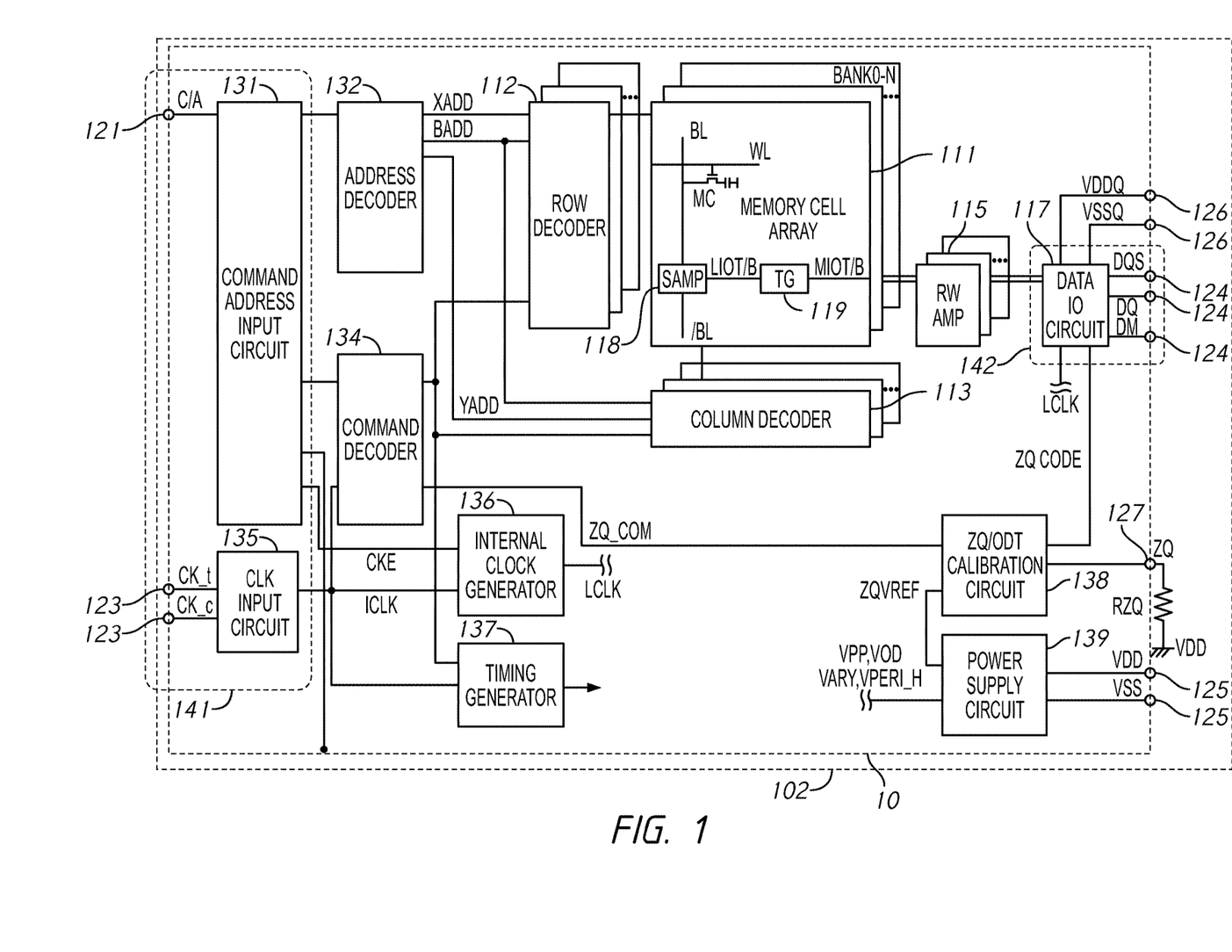
FIG. 1 is a schematic block diagram of a semiconductor device according to an embodiment of the disclosure.

FIG. 1 is a block diagram of a semiconductor device 10 in accordance with one embodiment of the present disclosure. The semiconductor device 10 may be a dynamic random-access memory (DRAM), such as a double data rate SDRAM integrated into a single semiconductor chip, for example. The semiconductor device 10 may be mounted on an external substrate 102, for example, a memory module substrate, a mother board or the like.

As shown in FIG. 1, the semiconductor device 10 includes a memory cell array 111. The memory cell array 111 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 112 and the selection of the bit line BL is performed by a column decoder 113. The row decoder 112 may include section predecoders, section selection control circuits and section selection circuits. Sense amplifiers 118 are coupled to corresponding bit lines BL and connected to local I/O line pairs LIOT/B. Local IO line pairs LIOT/B are connected to main IO line pairs MIOT/B via transfer gates TG which function as selector circuits.

Turning to the explanation of a plurality of external terminals included in the semiconductor device 10, the plurality of external terminals includes command/address terminals 121, clock terminals 123, data terminals 124, power supply terminals 125 and 126, and a calibration terminal ZQ 127. An input signal block 141 may include the command/address terminals 121. The command/address terminals 121 and signal lines coupled to the command/address terminal 121 may include a first set of terminals and signal lines that are configured to receive the command signals and a separate, second set of terminals and signal lines that configured to receive the address signals, in some examples. In other examples, the terminals 121 and signal lines associated with command/address terminals 121 the may include common terminals and signal lines that are configured to receive both command signal and address signals. The input signal block 141 may include the clock terminals 123 which include input buffers. A data interface block 142 includes the data terminals 124 that will be later described, according to one embodiment. The data terminals 124 may be coupled to output buffers for read operations of memories. Alternatively, the data terminals 124 may be coupled to input buffers for read/write access of the memories. FIG. 1 shows an example of dynamic random access memory (DRAM), however, any device having external terminals for signal input/output may be included as the external terminals of embodiments of the present disclosure. Each terminal of the plurality of external terminals may include a pad. A plurality of pads in the plurality of external terminals 124 will be explained below in detail.

The semiconductor device 10 includes a command/address input circuit 131. The command/address input circuit 131 may receive an address signal ADD and a bank address signal BADD from the command/address terminals 121, and transmit the address signal ADD and the bank address signal BADD to an address decoder 132. The address decoder 132 may decode the address signal ADD and provide a decoded row address signal XADD to the row decoder 112, and a decoded column address signal YADD to the column decoder 113. The address decoder 132 also may also receive the bank address signal BADD and provide the bank address signal BADD to the row decoder 112 and the column decoder 113.

The command/address input circuit 131 may receive a command signal from outside, such as, for example, a memory controller, at the command/address terminals 121. The command/address input circuit 131 may provide the command signal to the command decoder 134. The command decoder 134 may decode the command signal and generate various internal command signals. The internal command signals may be used to control operation and timing of various circuits of the semiconductor device 10. For example, the internal command signals may include a row command signal, such as an active command, to select a word line and a column command signal, such as a read command or a write command, to select a bit line, and a calibration signal ZQ_COM to a ZQ calibration circuit 138.

Accordingly, when an active command is issued with a row address and a column address is timely supplied with a read command, read data is read from a memory cell MC in the memory cell array 111 designated by these row address and column address. The read data DQ is output externally from the data terminals 124 via a read/write amplifier 115 and a data input/output circuit 117. When the write command is issued and a column address is timely supplied with this command, and then write data DQ is supplied to the data terminals 124 in synchronization with a data strobe signal DQS while a data mask signal DM allowing masking of invalid write data is not active. The write data DQ is supplied via the data input/output circuit 117 and the read/write amplifier 115 to the memory cell array 111 and written in the memory cell MC designated by the row address and the column address.

The clock terminals 123 are supplied with external clock signals CK_t and CK_c, respectively. These external clock signals CK_t and CK_c are complementary to each other and are supplied to a clock input circuit 135. The clock input circuit 135 receives the external clock signals CK_t and CK_c and generates an internal clock signal ICLK. The internal clock signal ICLK is supplied to an internal clock generator 136 and thus a phase controlled internal clock signal LCLK is generated based on the received internal clock signal ICLK and a clock enable signal CKE from the command/address input circuit 131. The phase controlled internal clock signal LCLK is supplied to the data input/output circuit 117 and is used as a timing signal for determining an output timing of the read data DQ. The internal clock signal ICLK is also supplied to a timing generator 137 and thus various internal clock signals can be generated.

The power supply terminals 125 are supplied with power supply potentials VDD and VSS. These power supply potentials VDD and VSS are supplied to an internal power supply circuit 139. The internal power supply circuit 139 generates various internal potentials, for example, VPP, VOD, VARY, VPERI, and a reference potential ZQVREF based on the power supply potentials VDD and VSS. The internal potential VPP is mainly used in the row decoder 112, the internal potentials VOD and VARY are mainly used in the sense amplifiers 118 included in the memory cell array 111, and the internal potential VPERI may be used in many other circuit blocks in a peripheral region outside the memory cell array 111. The reference potential ZQVREF is used in the ZQ calibration circuit 138.

The power supply terminals 126 are supplied with power supply potentials VDDQ and VSSQ. These power supply potentials VDDQ and VSSQ are supplied to the data input/output circuit 117. The power supply potentials VDDQ and VSSQ may be the same potentials as the power supply potentials VDD and VSS that are supplied to the power supply terminals 125, respectively. However, the power supply potentials VDDQ and VSSQ may be used for the data input/output circuit 117 so that power supply noise generated by the input/output circuit 117 does not propagate to the other circuit blocks.

The calibration terminal ZQ 127 is connected to the calibration circuit 138. The calibration terminal ZQ 127 is also connected to an external resistor $R_{ZQ}$ included in the external substrate 102. The ZQ calibration circuit 138 performs a calibration operation with reference to an impedance of the external resistance $R_{ZQ}$ and the reference potential ZQVREF responsive to the calibration signal ZQ_COM, and provide an impedance code ZQCODE may be provided by the calibration operation, thus impedances of input buffers and output buffers in the data input/output circuit 117 can be adjusted.

Figure 2:
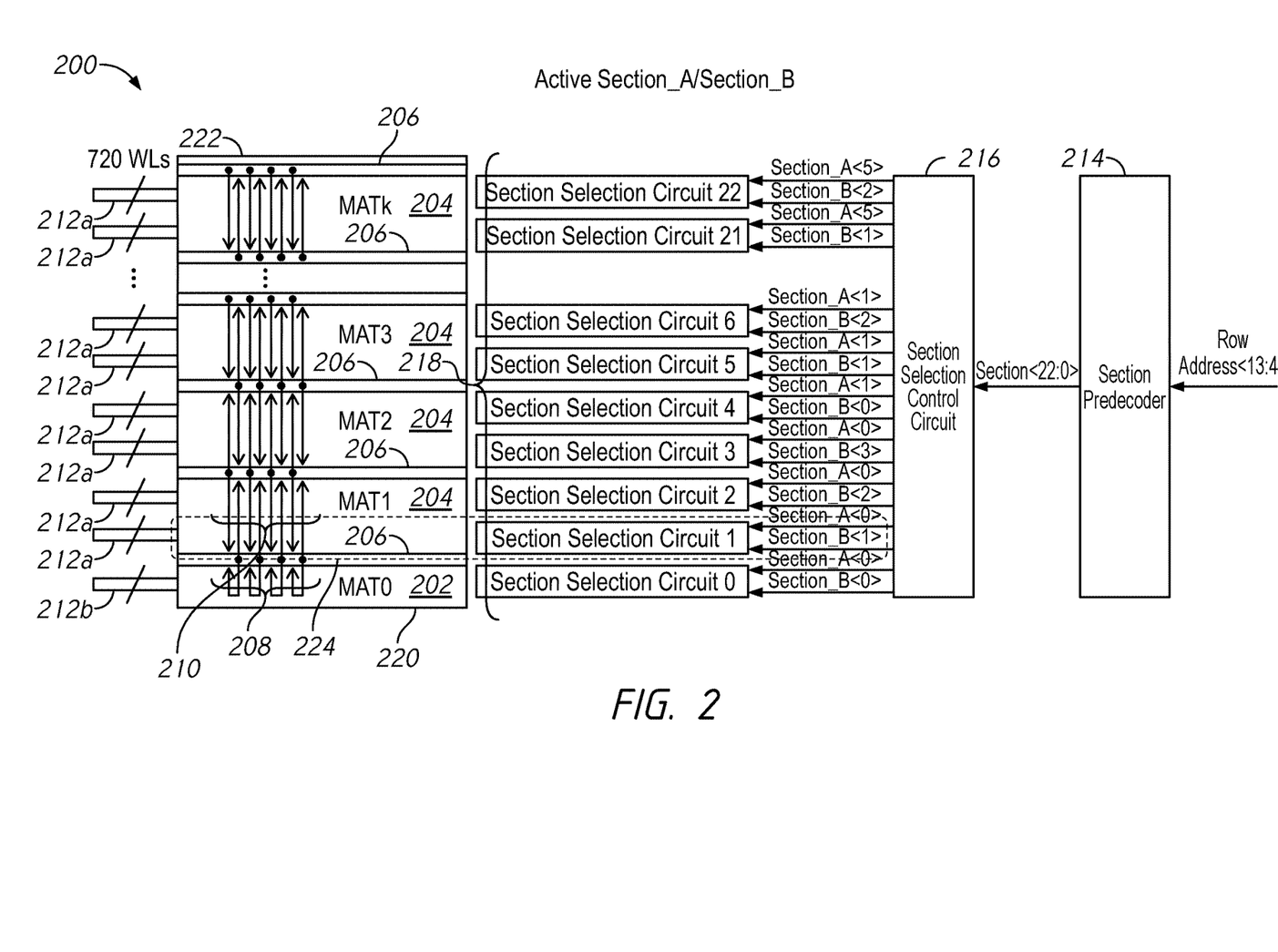
FIG. 2 is a schematic diagram of a portion of a semiconductor device according to an embodiment of the present disclosure.

FIG. 2 is a schematic diagram of a portion 200 of a semiconductor device according to an embodiment of the present disclosure. In some embodiments, the semiconductor device may be the semiconductor device 10 of FIG. 1. In some embodiments, the portion 200 may be a bank. In some embodiments, the portion 200 may include a plurality of blocks including a block 222.

The block 222 may include a plurality of memory cell matrices (mats). The plurality of mats may include non-edge mats 204 (e.g., MAT1 to MATk) and an edge mat 202 (e.g., MAT0) including an end 220. In some embodiments, the end 220 may be an end of a bank including the block 222. Each of the mats may include at least one section. For example, in some embodiments, an edge mat 202 may include one section and the non-edge mats 204 include a plurality of sections.

The non-edge mats 204 may include memory cells that may be accessed by word lines 212a and bit lines 210 responsive to row address signals and column address signals, respectively. The bit lines 210 may extend from sense amplifiers 206 adjacent to each non-edge mat 204. The edge mat 202 may include memory cells that may be accessed by word lines 212b and folded bit lines 208 responsive to row address signals and column address signals, respectively. In some embodiments, a number of word lines 212a coupled to each of the non-edge mats 204 may be configured to include twice (e.g. 1440 in FIG. 2) the number of word lines 212b (e.g., 720 in FIG. 2). The folded bit lines 208 may be coupled to a sense amplifier 206 between the edge mat 202 (MAT0) and the non-edge mat 204 (Mat1). The folded bit lines 208 may extend from the sense amplifier 206 to the end 220, be folded and further extend from the end 220 towards the sense amplifier 206.

The portion 200 may include a section predecoder 214. In some embodiments, the section predecoder 214 may be included in a row decoder 112 of FIG. 1. In some embodiments, the section predecoder 214 may include logic circuits where each logic circuit may correspond to a relationship between at least a portion of a combination of row address signals (e.g., Row Address (RA)<13:4>) and a section signal of a plurality of section signals (e.g., Section<22:0>). Depending on the relationship, the section predecoder 214 may decode the row address signals and further generate the section signals Section<22:0> based on a section to be activated by a current command, responsive to the row address signals RA<13:4>. In other words, the section predecoder 214 activates at least one of the plurality of the section signals Section<22:0>, responsive to a portion of the combination of the row address signals, such as RA<13:4>.

Figure 3A:
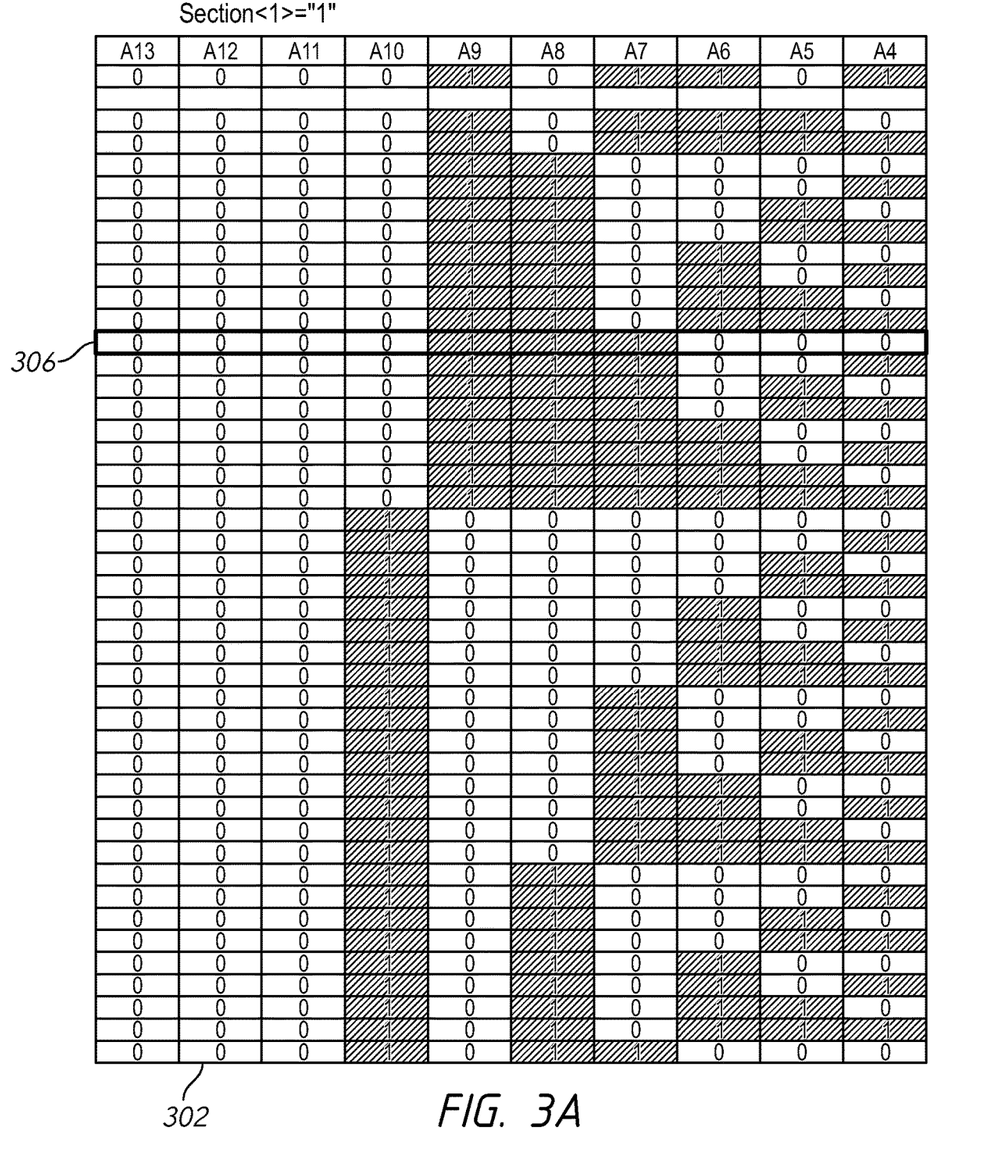
FIGS. 3A and 3B are example truth tables of a section predecoder, according to an embodiment of the disclosure.
Figure 3B:
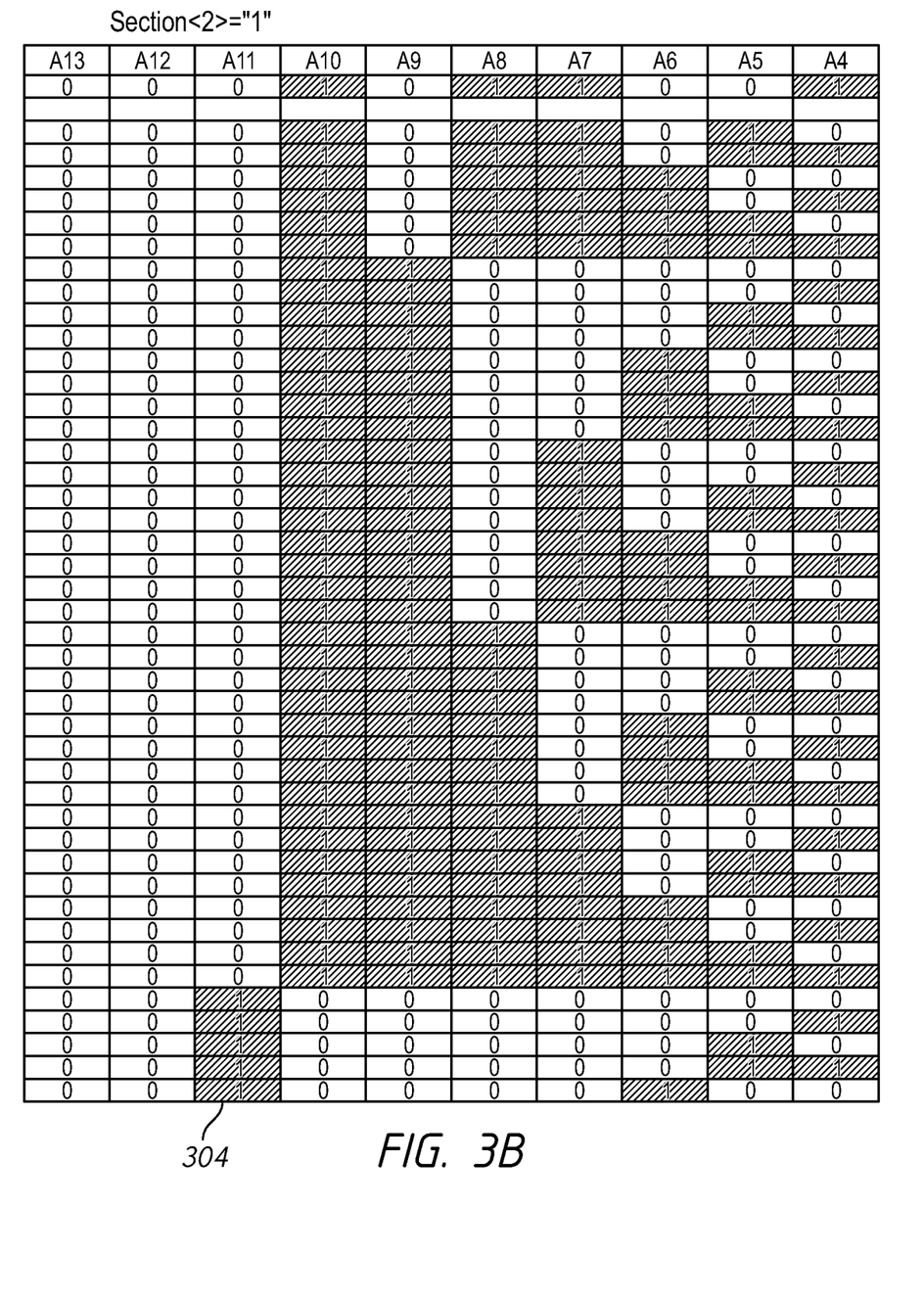

FIGS. 3A and 3B are example truth tables 302 and 304 of the section predecoder 214 of FIG. 2, according to an embodiment of the disclosure. The truth table 302 of FIG. 3A shows combinations of the row address signals RA<13:4> as input signals when the section predecoder 214 provides the section signal <1> in an active state, such as a logic high level ("1"). For example, one of the combinations of the row address signals RA<13:4> in a box 306 is "0000111000" where RA<9:7> are "1" and other row address signals RA<13:10; 6-4> are "0."

Similarly, the truth table 304 of FIG. 3B shows combinations of the row address signals RA<13:4> as input signals when the section predecoder 214 provides the section signal <2> in an active state, such as a logic high level ("1"). For each combination of row addresses RA<13:4>, one section signal of the section signals <22:0> may be activated uniquely.

Returning to FIG. 2, the portion 200 may include a section selection control circuit 216. In some embodiments, the section selection control circuit 216 may be included in a row decoder 112 of FIG. 1. In some embodiments, the section selection control circuit 216 may include logic circuits. Each of the logic circuits may correspond to a relationship between each section signal of the section signals Section<22:0> and a combination of a plurality of sets of section sub-signals (e.g., Section_A<5:0> and Section_B<3:0>). Depending on the relationship, the section selection control circuit 216 may provide the plurality of sets of section sub-signals (e.g., Section_A<5:0> and Section_B<3:0>) based on the at least one of the plurality of the section signals <22:0>. The section selection control circuit 216 provides the plurality of sets of section sub-signals (e.g., Section_A<5:0> and Section_B<3:0>) as output signals. In some embodiments, a number of signals in the plurality of sets of section sub-signals (e.g., 6+4=10) may be less than a number of signals in the section signals (e.g., 23). In some embodiments, a number of sections which can be expressed by the plurality of sets of section sub-signals (e.g., 6×4=24) may be greater than the number of signals in the section signals (e.g., 23).

Figure 4:
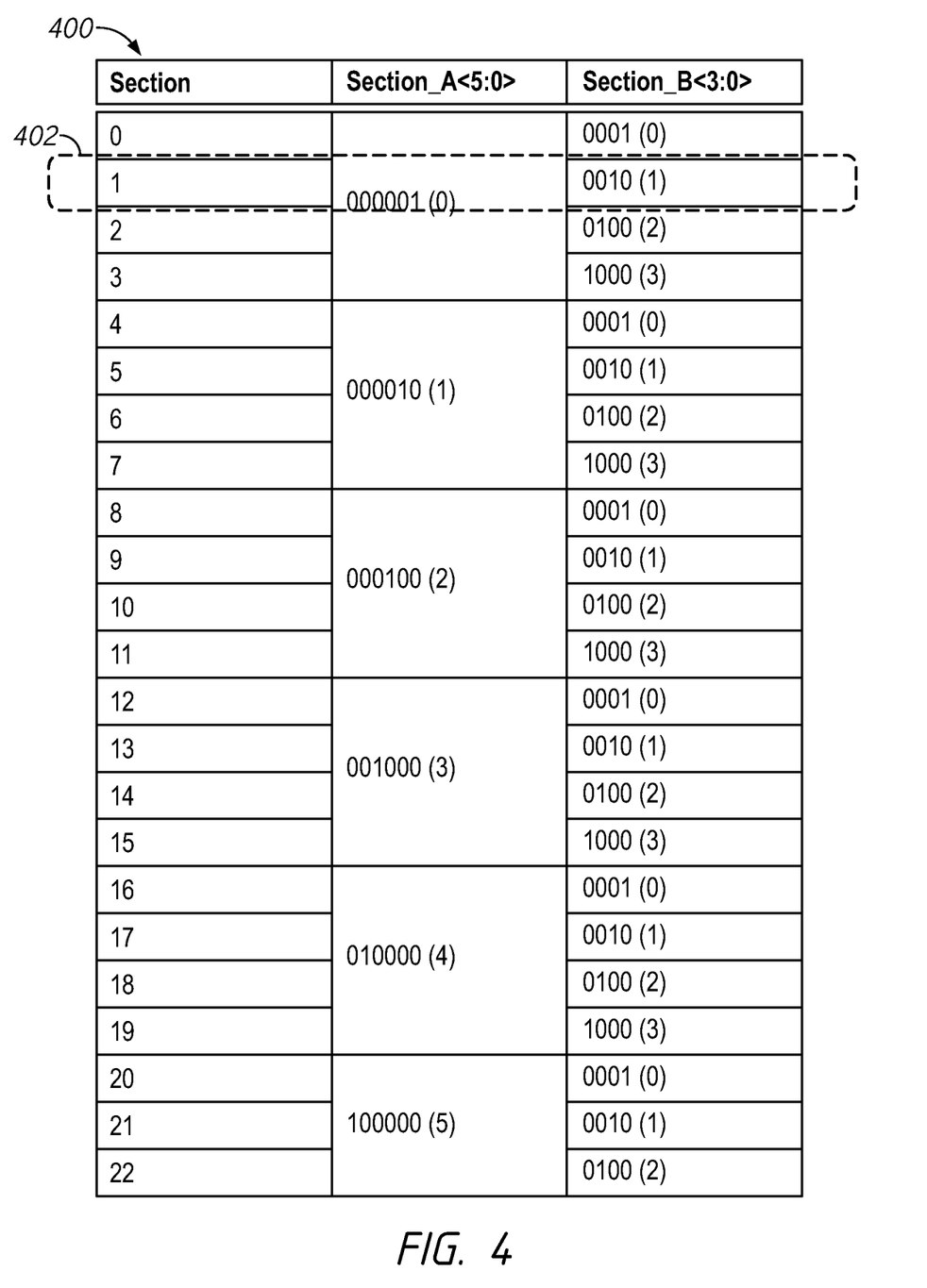
FIG. 4 is an example truth table of a section selection control circuit, according to an embodiment of the disclosure.

FIG. 4 is an example truth table 400 of the section selection control circuit 216 of FIG. 2, according to the embodiment of the disclosure. The truth table 400 shows a relationship between each section signal of the section signals Section<22:0> and a combination of a plurality of sets of section sub-signals (e.g., Section_A<5:0> and Section_B<3:0> in FIG. 2) when each section signal in an active state, such as a logic high level ("1"). In the example truth table 400, a set of section sub-signals Section_A<5:0> may indicate six different values by six bits, each value having one corresponding bit in an active state among six bits. Similarly, a set of section sub-signals Section_B<3:0> may indicate four different values by four bits, each value having one corresponding bit in an active state among four bits. For example, as shown in a box 402, when a section signal <1> of the section signals <22:0> is activated (e.g., "1"), the set of section sub-signals Section_A<5:0> may be "000001" that indicates "0" and the set of section sub-signals Section_B<3:0> may be "0010" that indicates "1." The section selection control circuit 216 may provide a unique set of section sub-signals (e.g., Section_A<5:0> and Section_B<3:0>) for each of the section signals Section <22:0>.

The block 222 may include sections. In some embodiments, the edge mat 202 may include a section (e.g., Section 0) and each of non-edge mats 204 may include a plurality of sections (e.g., Section 1, 2, . . . ), where each section includes a number of memory cells equal to a number of memory cells of the edge mat 202. In FIG. 2, the non-edge mat 204 may include two sections. Each section of the non-edge mats 204 and the edge mat 202 may be accessed by 720 word lines.

The portion 200 may include section selection circuits 218. Each section selection circuit 218 may be activated responsive to a corresponding pair of one section sub-signal Section_A of the set of section sub-signals Section_A<5:0> and one section sub-signal Section_B of the set of section sub-signals Section_B<3:0>. For example, as shown in a box 224, the section selection circuit 1 218 may be activated responsive to a pair of section sub-signals Section_A<0> and Section_B<1> in an active state, such as a logic high level ("1"). Thus, Section 1 in the non-edge mat 204 (e.g., Mat1) may be activated for access.

Figure 5:
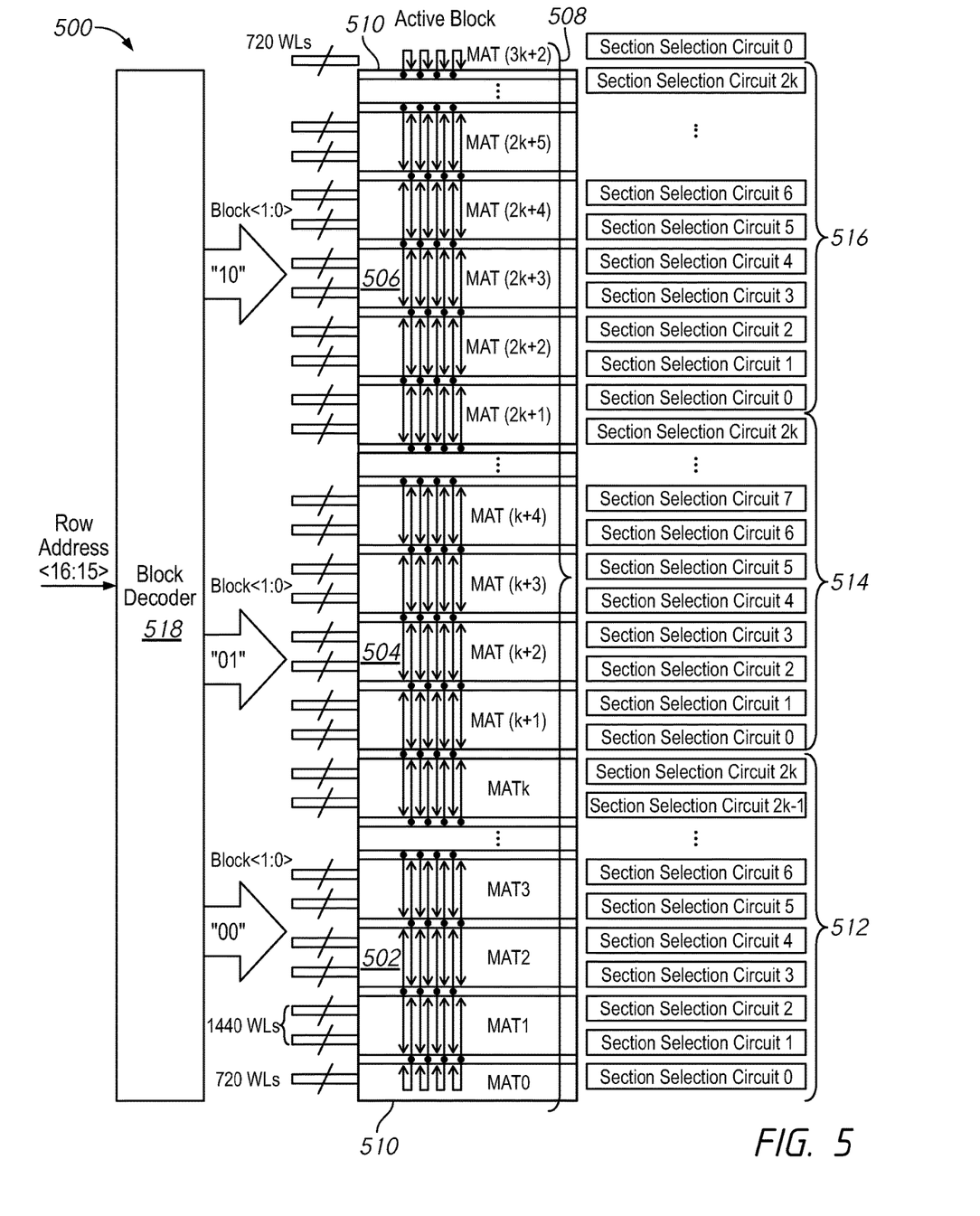
FIG. 5 is a schematic diagram of a portion of a semiconductor device according to an embodiment of the present disclosure.

FIG. 5 is a schematic diagram of a portion 500 of a semiconductor device according to an embodiment of the present disclosure. In some embodiments, the semiconductor device may be the semiconductor device 10 of FIG. 1. In some embodiments, the portion 500 may be a bank. In some embodiments, the portion 500 may include a plurality of blocks including blocks 502, 504 and 506.

The portion 500 may include a plurality of mats 508 (e.g., MAT0–MAT(3k+2)) divided into the blocks 502, 504 and 506. For example, the block 502 may include an edge mat MAT0 and non-edge mats MAT1–MATk. The block 504 may include non-edge mats MAT(k+1)–MAT2k and a portion of a non-edge mat MAT(2k+1). The block 506 may include the other portion of the non-edge mat MAT(2k+1), non-edge mats MAT(2k+2)–MAT(3k+1). An edge mat MAT(3k+2) may be outside the block 506. The portion 500 may include ends 510 included in the edge mats MAT0 and MAT(3k+2). The edge mats MAT0 and MAT(3k+2) may be accessed by folded bit lines and word lines (e.g., 720 word lines). The non-edge mats MAT1–MAT(3k+1) may be accessed by bit lines and word lines (e.g., 1440 word lines). In some examples, each mat of non-edge mats and edge mats of the blocks 502, 504 and 506 may have a similar access (bit lines and word lines) structure as each mat of the non-edge mats 204 and the edge mat 202 of the block 222, the description of which is not repeated.

In FIG. 5, each of the edge mats MAT0 and MAT(3k+2) may include one section (e.g., Section Selection Circuit 0), whereas the non-edge mats MAT1–MAT(3k+1) may include two sections. Each section includes a number of memory cells equal to a number of memory cells of each edge mat. Each section of the non-edge mats 204 and the edge mat 202 may be accessed by 720 word lines. Each block of the blocks 502, 504 and 506 may include a same number of sections 0-2k. The portion 500 may include corresponding sets of section selection circuits 0-2k 512, 514 and 516, corresponding to the sections 0-2k of the blocks 502, 504 and 506, respectively. In some embodiments, a mat with a lowest number within a block (e.g., MAT0 of the block 502, MAT(k+1) of the block 504, MAT(2k+1) of the block 506 may include Section 0 that may be activated by the section selection circuit 0. A mat with a highest number within the block may include Section 2k that may be activated by the section selection circuit 2k. Each block of the blocks 502, 504 and 506 may have a set of the section selection circuits 0-2k 512, 514 and 516 having similar circuit structures. Having similar circuit structures may reduce a footprint of the section selection circuits compared to typical designs.

The portion 500 may include a block decoder 518. In some embodiments, the block decoder 518 may be included in a row decoder 112 of FIG. 1. In some embodiments, the block decoder 518 may receive at least a portion of a combination of row address signals (e.g., Row Address (RA)<16:15>). Depending on the relationship, the block decoder 518 may decode the row address signals and further generate block signals Block<1:0> indicative of a block to be activated by a current command, responsive to the row address signals RA<16:15>. In other words, the block decoder 518 activates at least one of the block signals Block<1:0>, responsive to a portion of the combination of the row address signals, such as RA<16:15>.

Figure 6:
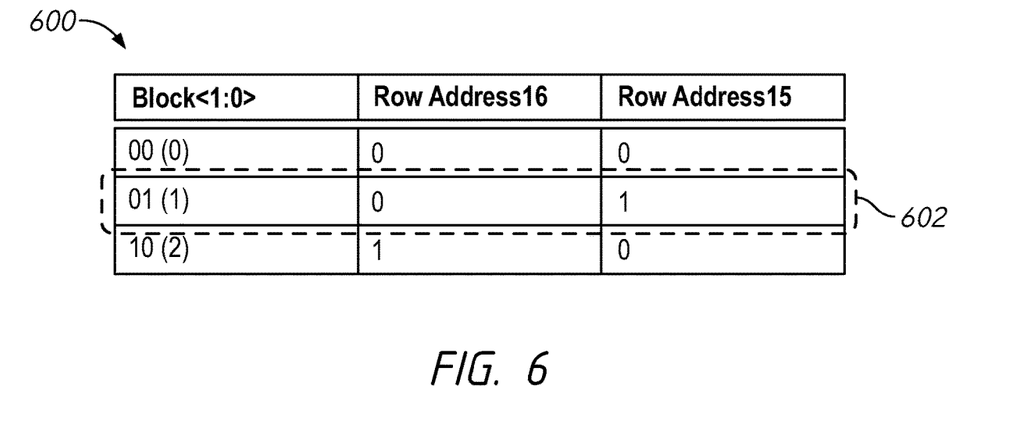
FIG. 6 is an example truth table of a block decoder, according to an embodiment of the disclosure

FIG. 6 is an example truth table 600 of the block decoder 518 of FIG. 5, according to an embodiment of the disclosure. The truth table 600 shows combinations of the row address signals RA<16:15> as input signals when the block decoder 518 provides the block signal Block<1:0> in an active state, such as a logic high level ("1"). For example, one of the combinations of the row address signals RA<16:15> in a box 602 is "01" and the block "01 (1)" (e.g., the block 504 in FIG. 5) is selected.

Figure 7:
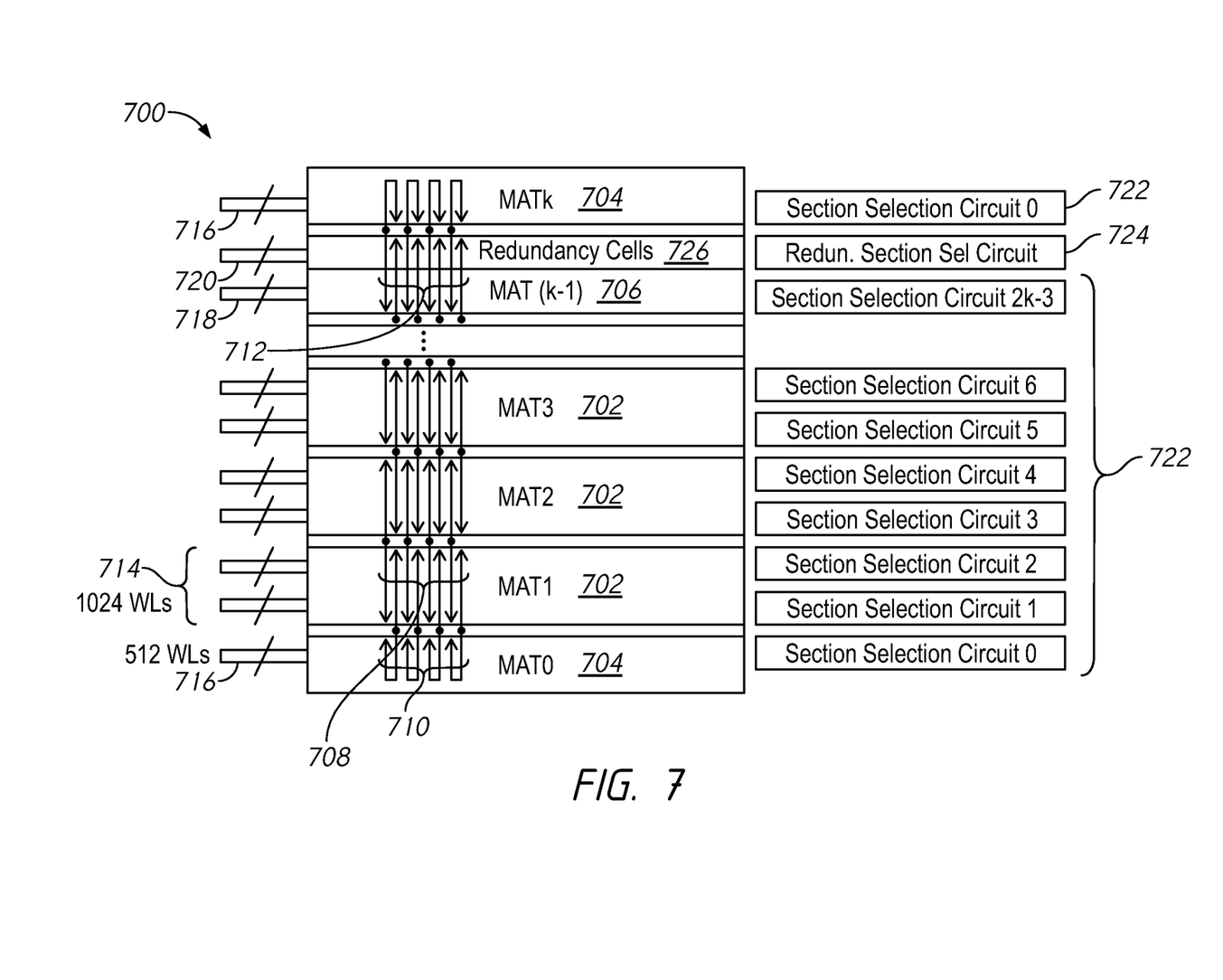
FIG. 7 is a schematic diagram of a portion of a semiconductor device according to an embodiment of the present disclosure.

FIG. 7 is a schematic diagram of a portion 700 of a semiconductor device according to an embodiment of the present disclosure. In some embodiments, the portion 700 may be a bank in the semiconductor device, such as a semiconductor device 10 of FIG. 1.

The portion 700 may include a plurality of memory cell matrices (mats). The plurality of mats may include non-edge mats 702 (e.g., MAT1 to MAT(k−1)) including a mat 706 (MAT(k−1)), and may further include edge mats 704 (e.g., MAT0 and MATk). The non-edge mats 702 may include memory cells that may be accessed by word lines 714 and bit lines 708 responsive to row address signals and column address signals, respectively. The edge mats 704 may include memory cells that may be accessed by word lines 716 and folded bit lines 710 responsive to row address signals and column address signals, respectively. In some embodiments, a number of word lines 714 coupled to each of the non-edge mats 702 may be configured as twice (e.g. 1024 WLs in FIG. 7) the number of word lines 716 (e.g., 512 WLs in FIG. 7) of each edge mat 704. The non-edge mat 706 may include memory cells that may be accessed by word lines 718 and bit lines 712. The non-edge mat 706 may include redundancy cells 726 that may be accessed by word lines 720 and the bit lines 712.

The portion 700 may include sections. In some embodiments, the edge mat 704 (e.g., Mat0 or Matk) may include a section, and each of non-edge mats 702 may include a plurality of sections (e.g., Sections 1-2, Sections 3-4, Sections 5-6, . . . ), where each section includes a number of memory cells equal to a number of memory cells of each edge mat 704. In FIG. 7, the non-edge mat 702 includes two sections. Each section of the non-edge mats 702 and the edge mats 704 may be accessed by 720 word lines. The non-edge mat 706 may include a section (e.g., Section 2k−3) and a redundancy section including the redundancy cells 726.

The portion 700 may include section selection circuits 722. Each section selection circuit 722 may be activated responsive to a corresponding pair of section sub-signals, such as one section sub-signal Section_A of the set of section sub-signals Section_A<(m−1):0> (e.g., Section_A<5:0> in FIG. 2) and one section sub-signal Section_B of the set of section sub-signals Section_B<(n−1):0> (e.g., Section_B<3:0> in FIG. 2) based on a portion of row address signals, where m and n are natural numbers. Thus, a section corresponding to the activated section selection circuits 722 may be activated for access. The portion 700 may further include a redundancy section selection circuit 724. The redundancy section selection circuit 724 may be activated responsive to a corresponding pair of section sub-signals, such as the section sub-signal Section_A of the set of section sub-signals Section_A<(m−1):0> and one section sub-signal Section_B of the set of section sub-signals Section_B<(n−1):0>, that are provided based on a portion of the row address signals indicative of one of the redundancy cells 726. Consequently, a redundancy section corresponding to the section selection circuits 724 may be activated for access.

Figure 8:
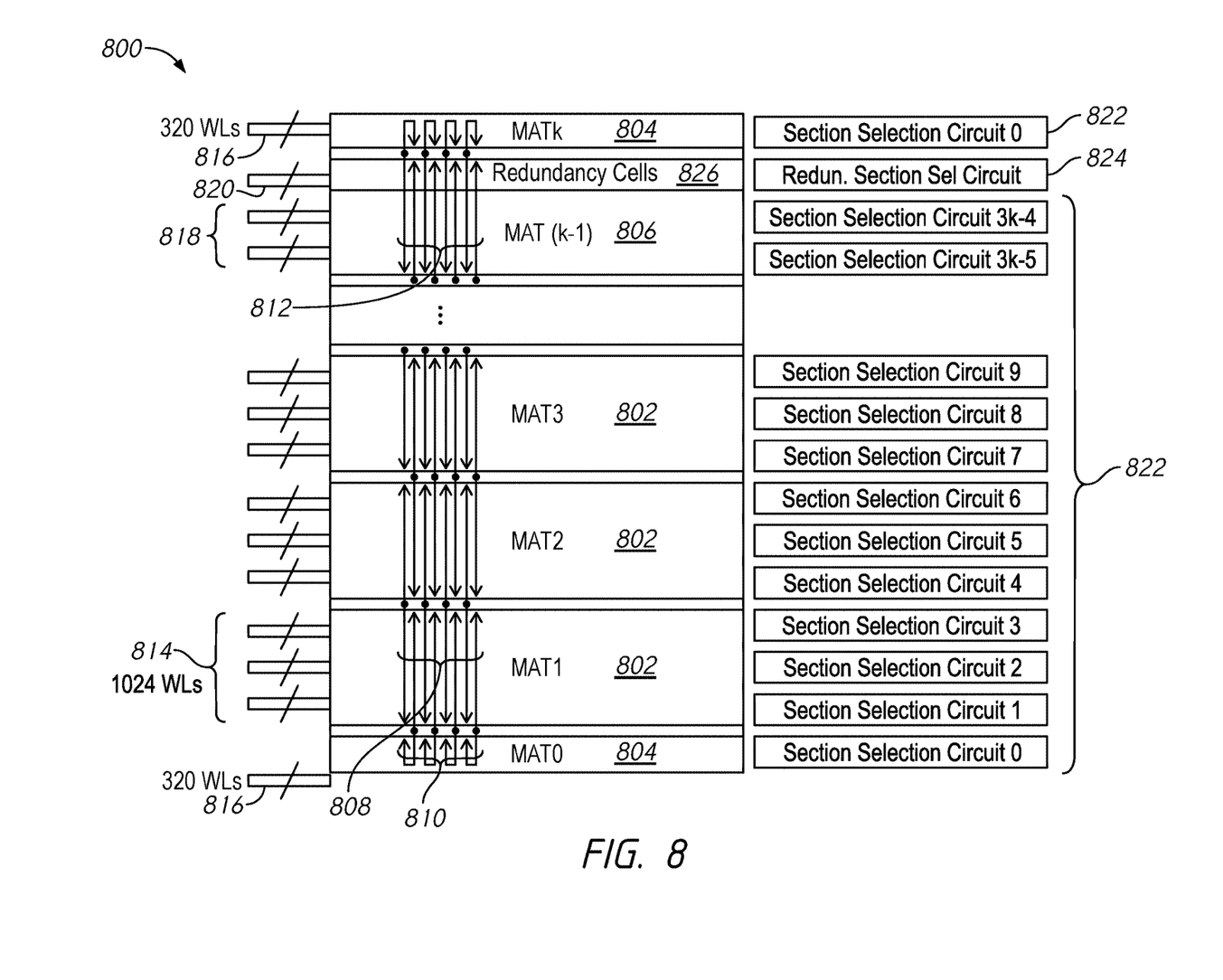
FIG. 8 is a schematic diagram of a portion of a semiconductor device according to an embodiment of the present disclosure.

FIG. 8 is a schematic diagram of a portion 800 of a semiconductor device according to an embodiment of the present disclosure. In some embodiments, the portion 800 may be a bank in the semiconductor device, such as a semiconductor device 10 of FIG. 1.

The portion 800 may include a plurality of memory cell matrices (mats). The plurality of mats may include non-edge mats 802 (e.g., MAT1 to MAT(k−1)) including a mat 806 (MAT(k−1)) and edge mats 804 (e.g., MAT0 and MATk). The non-edge mats 802 may include memory cells that may be accessed by word lines 814 and bit lines 808 responsive to row address signals and column address signals, respectively. The edge mats 804 may include memory cells that may be accessed by word lines 816 and folded bit lines 810 responsive to row address signals and column address signals, respectively. In some embodiments, a number of word lines 814 coupled to each of the non-edge mats 802 may be configured as approximately three times (e.g. 1024 in FIG. 8) as the number of word lines 816 (e.g., 320 in FIG. 8). The non-edge mat 806 may include memory cells that may be accessed by word lines 818 and bit lines 812. The non-edge mat 806 may include redundancy cells 826 that may be accessed by word lines 820 and the bit lines 812. In some embodiments, a number of word lines 820 may be nearly equal to the number of word lines 816 coupled to the edge mat 804.

The portion 800 may include sections. In some embodiments, the edge mat 804 (e.g., Mat0 or Matk) may include a section, each of non-edge mats 802 may include a plurality of sections (e.g., Sections 1-3, Sections 4-6, . . . ), where each section includes a number of memory cells nearly equal to a number of memory cells of each edge mat 804. In FIG. 8, the non-edge mat 802 includes three sections. Each section of the non-edge mats 802 and the edge mats 804 may be accessed by approximately 320 word lines. The non-edge mat 806 may include sections (e.g., Section 3k−4 and Section 3k−5) and a redundancy section including the redundancy cells 826.

The portion 800 may include section selection circuits 822. Each section selection circuit 822 may be activated responsive to a corresponding pair of section sub-signals, such as one section sub-signal Section_A of the set of section sub-signals Section_A<(m−1):0> (e.g., Section_A<5:0> in FIG. 2) and one section sub-signal Section_B of the set of section sub-signals Section_B<(n−1):0> (e.g., Section_B<3:0> in FIG. 2) based on a portion of row address signals, where m and n are natural numbers. Thus, a section corresponding to the activated section selection circuits 822 may be activated for access. The portion 800 may further include a redundancy section selection circuit 824. The redundancy section selection circuit 824 may be activated responsive to a corresponding pair of section sub-signals, such as the section sub-signal Section_A of the set of section sub-signals Section_A<(m−1):0> and one section sub-signal Section_B of the set of section sub-signals Section_B<(n−1):0>, that are provided based on a portion of the row address signals indicative of one of the redundancy cells 826. Consequently, a redundancy section corresponding to the section selection circuits 824 may be activated for access.

Selection of mats, including non-edge mats and edge mats including folded bit lines may be controlled section by section. Each edge mat may include one section and each non-edge mat may include a plurality of sections. A number of word lines coupled to each section (e.g., a size of the section) may be the same as a number of word lines coupled to each edge mat. Section selection circuits may be provided for accessing corresponding sections. Section selection circuits may control section selection based on at least a portion of row address signals. The section selection circuits may have substantially similar circuit structures. By having the section selection circuits of the similar circuit structures, a number of wirings may be reduced and thus a chip area and power consumption may be reduced.

Although various embodiments have been disclosed, it will be understood by those skilled in the art that the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

What is claimed is:

1. An apparatus comprising:
   a plurality of memory cell matrices including memory cells;
   a plurality of sections wherein each section is included in a memory cell matrix of the plurality of memory cell matrices;
   a section predecoder configured to decode a portion of row address signals and further configured to activate a section signal among a plurality of corresponding section signals responsive to the portion of row address signals;
   a section selection control circuit configured to provide a plurality of sets of section sub signals based on the plurality of section signals, the plurality of sets of section sub signals including:
      a set of first section sub signals including an active first section sub signal; and
      a set of second section sub signals including an active second section sub signal; and
   a plurality of section selection circuits corresponding to the plurality of sections,
   wherein one section selection circuit among the plurality of section selection circuits is configured to activate the corresponding section responsive to the active first and second section sub signals.

2. The apparatus of claim 1, wherein the set of first section sub signals including the active first section sub signal and the set of second section sub signals including the active second section sub signal is unique to the activated section signal.

3. The apparatus of claim 1, wherein a number of signals in the plurality of section signals is less than a number of signals in the plurality of sets of section sub signals.

4. The apparatus of claim 1, wherein a number of signals in the plurality of section signals is less than a number of sections expressed by the plurality of the first and second sets of section sub signals.

5. The apparatus of claim 1, wherein the plurality of memory cell matrices comprise a memory cell matrix at an end, and
   wherein a size of each section of the plurality of sections is the same as a size of the memory cell matrix.

6. The apparatus of claim 5, wherein the size of each section of the plurality of sections corresponds to a number of word lines coupled to each section.

7. The apparatus of claim 5, further comprising a sense amplifier between the memory cell matrix that is a first memory cell matrix and a second memory cell matrix adjacent to the first memory cell matrix,
   wherein the first memory cell matrix comprises folded bit lines that extend from the sense amplifier to the end and further extend from the end towards the sense amplifier.

8. The apparatus of claim 5, wherein the memory cell matrix at the end is a first memory cell matrix,
   wherein the plurality of memory cell matrices comprise a second memory cell matrix, and
   wherein the second memory cell matrix includes two or more sections among the plurality of sections.

9. The apparatus of claim 8, wherein the second memory cell matrix is disposed between two memory cell matrices of the plurality of memory cell matrices.

10. The apparatus of claim 8, wherein a number of word lines coupled to the second memory cell matrix is equal to or greater than twice a number of word lines coupled to the first memory cell matrix.

11. The apparatus of claim 1, wherein:
    the portion of row address signals comprises a second portion of the row address signals; and
    the apparatus further comprises:
       a bank comprising a plurality of blocks, the plurality of blocks comprising the plurality of memory cell matrices; and
       a block decoder configured to decode a first portion of the row address signals different from the second portion of the row address signals, and further configured to provide one or more block signals that is configured to activate one of the plurality of blocks responsive to the first portion of row address signals.

12. The apparatus of claim 11, wherein each block comprises a same number of sections and a same number of corresponding section selection circuits.

13. An apparatus comprising:
    a plurality of memory cell matrices including memory cells;
    a plurality of sections wherein each section is included in a memory cell matrix of the plurality of memory cell matrices;
    a section predecoder configured to decode a portion of row address signals and further configured to activate a section signal among a plurality of corresponding section signals responsive to the portion of row address signals;

a section selection control circuit configured to provide a plurality of sets of section sub signals based on the plurality of section signals, the plurality of sets of section sub signals including:
- a set of first section sub signals including an active first section sub signal; and
- a set of second section sub signals including an active second section sub signal; and a plurality of section selection circuits corresponding to the plurality of sections, wherein one section selection circuit among the plurality of section selection circuits is configured to activate the corresponding section responsive to the active first and second section sub signals, wherein:
- the plurality of memory cell matrices comprises a first memory cell matrix at an end;
- the plurality of memory cell matrices comprises a second memory cell matrix; and
- a number of word lines coupled to the second memory cell matrix is equal to or greater than twice a number of word lines coupled to the first memory cell matrix.

14. The apparatus of claim 13, further comprising a sense amplifier between the first memory cell matrix and a third memory cell matrix adjacent to the first memory cell matrix, wherein the first memory cell matrix comprises folded bit lines that extend from the sense amplifier to the end and further extend from the end towards the sense amplifier.

15. The apparatus of claim 13, wherein the set of first section sub signals including the active first section sub signal and the set of second section sub signals including the active second section sub signal is unique to the activated section signal.

16. The apparatus of claim 13, wherein a number of signals in the plurality of section signals is less than a number of signals in the plurality of sets of section sub signals.

17. The apparatus of claim 13, wherein a number of signals in the plurality of section signals is less than a number of sections expressed by the plurality of the first and second sets of section sub signals.

18. The apparatus of claim 13, wherein the size of each section of the plurality of sections corresponds to a number of word lines coupled to each section.

19. The apparatus of claim 13, wherein the first memory cell matrix includes a section among the plurality of sections and the second memory cell matrix includes two or more sections among the plurality of sections.

* * * * *